(12) United States Patent
Jiang et al.

(10) Patent No.: US 7,312,101 B2
(45) Date of Patent: Dec. 25, 2007

(54) PACKAGED MICROELECTRONIC DEVICES AND METHODS FOR PACKAGING MICROELECTRONIC DEVICES

(75) Inventors: Tongbi Jiang, Boise, ID (US); J. Mike Brooks, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 322 days.

(21) Appl. No.: 10/421,452

(22) Filed: Apr. 22, 2003

(65) Prior Publication Data
US 2004/0214373 A1    Oct. 28, 2004

(51) Int. Cl.
H01L 21/44 (2006.01)
H01L 21/48 (2006.01)
H01L 21/50 (2006.01)
H01L 21/20 (2006.01)

(52) U.S. Cl. .................. 438/106; 438/123; 438/381; 438/601

(58) Field of Classification Search ............. 438/106, 438/110, 127, 123, 124, 614, 381
See application file for complete search history.

(56) References Cited

U.S. PATENT DOCUMENTS

| | | | |
|---|---|---|---|
| 4,931,853 A * | 6/1990 | Ohuchi et al. ............... 257/679 |
| 5,008,213 A * | 4/1991 | Kolesar, Jr. .................. 438/107 |
| 5,081,563 A | 1/1992 | Feng et al. |
| 5,409,865 A * | 4/1995 | Karnezos ..................... 29/827 |
| 5,851,845 A | 12/1998 | Wood et al. |
| 5,933,713 A | 8/1999 | Farnworth |
| 5,946,553 A | 8/1999 | Wood et al. |
| 6,004,867 A | 12/1999 | Kim et al. |
| 6,008,070 A | 12/1999 | Farnworth |
| 6,020,624 A | 2/2000 | Wood et al. |
| 6,072,236 A | 6/2000 | Akram et al. |
| 6,124,634 A | 9/2000 | Akram et al. |
| 6,184,465 B1 | 2/2001 | Corisis |
| 6,187,615 B1 | 2/2001 | Kim et al. |
| 6,225,695 B1 | 5/2001 | Chia et al. |
| 6,228,687 B1 | 5/2001 | Akram et al. |
| 6,235,552 B1 | 5/2001 | Kwon et al. |
| 6,271,469 B1 | 8/2001 | Ma et al. |
| 6,326,697 B1 | 12/2001 | Farnworth |
| 6,326,698 B1 | 12/2001 | Akram |
| 6,407,381 B1 | 6/2002 | Glenn et al. |
| 6,452,255 B1 | 9/2002 | Bayan et al. |
| 6,459,163 B1 * | 10/2002 | Bai ............................ 257/787 |
| 6,503,780 B1 | 1/2003 | Glenn et al. |
| 6,537,848 B2 * | 3/2003 | Camenforte et al. ........ 438/106 |

(Continued)

Primary Examiner—Chuogn A. Luu
(74) Attorney, Agent, or Firm—Perkins Coie LLP

(57) ABSTRACT

Packaged microelectronic devices and methods for packaging microelectronic devices are disclosed herein. In one embodiment, a method of packaging a microelectronic device including a microelectronic die having a first side with a plurality of bond-pads and a second side opposite the first side includes forming a recess in a substrate, placing the microelectronic die in the recess formed in the substrate with the second side facing toward the substrate, and covering the first side of the microelectronic die with a dielectric layer after placing the microelectronic die in the recess. The substrate can include a thermal conductive substrate, such as a substrate comprised of copper and/or aluminum. The substrate can have a coefficient of thermal expansion at least approximately equal to the coefficient of thermal expansion of the microelectronic die or a printed circuit board.

55 Claims, 6 Drawing Sheets

U.S. PATENT DOCUMENTS 6,709,898 B1* 3/2004 Ma et al. .................. 438/122
2004/0135269 A1 7/2004 Otsuki
2004/0150101 A1* 8/2004 Fraley et al. ............... 257/723
2004/0214373 A1 10/2004 Jiang et al.

* cited by examiner

PACKAGED MICROELECTRONIC DEVICES AND METHODS FOR PACKAGING MICROELECTRONIC DEVICES

TECHNICAL FIELD

The present invention is related to packaged microelectronic devices and methods for packaging microelectronic devices.

BACKGROUND

Microelectronic devices are used in cell phones, pagers, personal digital assistants, computers, and many other products. A packaged microelectronic device can include a microelectronic die, an interposer substrate or lead frame attached to the die, and a molded casing around the die. The microelectronic die generally has an integrated circuit and a plurality of bond-pads coupled to the integrated circuit. The bond-pads are coupled to terminals on the interposer substrate or lead frame. The interposer substrate can also include ball-pads coupled to the terminals by traces in a dielectric material. An array of solder balls is configured so that each solder ball contacts a corresponding ball-pad to define a "ball-grid" array. Packaged microelectronic devices with ball-grid arrays are generally higher grade packages that have lower profiles and higher pin counts than conventional chip packages that use a lead frame.

Packaged microelectronic devices are typically made by (a) forming a plurality of dies on a semiconductor wafer, (b) cutting the wafer to singulate the dies, (c) attaching individual dies to an interposer substrate, (d) wire-bonding the bond-pads to the terminals of the interposer substrate, and (e) encapsulating the dies with a molding compound. It is time consuming and expensive to mount individual dies to individual interposer substrates. Also, as the demand for higher pin counts and smaller packages increases, it become more difficult to (a) form robust wire-bonds that can withstand the forces involved in molding processes and (b) accurately form other components of die level packaged devices. Therefore, packaging processes have become a significant factor in producing semiconductor and other microelectronic devices.

Another process for packaging microelectronic devices is wafer-level packaging. In wafer-level packaging, a plurality of microelectronic dies are formed on a wafer and then a redistribution layer is formed on top of the dies. The redistribution layer has a dielectric layer, a plurality of ball-pad arrays on the dielectric layer, and traces coupled to individual ball-pads of the ball-pad arrays. Each ball-pad array is arranged over a corresponding microelectronic die, and the ball-pads in each array are coupled to corresponding bond-pads on the die by the traces in the redistribution layer. After forming the redistribution layer on the wafer, a stenciling machine deposits discrete blocks of solder paste onto the ball-pads of the redistribution layer. The solder paste is then reflowed to form solder balls or solder bumps on the ball-pads. After formation of the solder balls on the ball-pads, the wafer can be cut to singulate the dies. Microelectronic devices packaged at the wafer-level can have high pin counts in a small area, but they are not as robust as devices packaged at the die-level.

Packaged microelectronic devices can also be produced by "build-up" packaging. For example, a sacrificial substrate can be attached to a panel including a plurality of microelectronic dies and an organic filler that couples the dies together. The sacrificial substrate is generally a ceramic disc, and it is attached to the active side of the microelectronic dies. Next, the back side of the microelectronic dies is thinned, and then a ceramic layer is attached to the back side. The sacrificial substrate is then removed from the active side of the dies and build-up layers or a redistribution layer can be formed on the active side of the dies. Packaged devices using a build-up approach on a sacrificial substrate provide high pin counts in a small area and a reasonably robust structure.

The build-up packaging process, however, has several drawbacks. For example, the process is relatively expensive and may not be used on equipment set up for circular substrates. Furthermore, the resulting packaged microelectronic devices do not have an effective mechanism for dissipating heat, which can significantly impair the electrical performance of the device. Accordingly, there is a need for an efficient and cost-effective process to package microelectronic dies that have heat dissipation mechanisms.

SUMMARY

The present invention is directed to packaged microelectronic devices and methods for packaging microelectronic devices. One aspect of the invention is directed to a method of packaging a microelectronic device that includes a microelectronic die having an integrated circuit, a first side with a plurality of bond-pads electrically coupled to the integrated circuit, and a second side opposite the first side. In one embodiment, the method includes forming a recess in a substrate, placing the microelectronic die in the recess formed in the substrate with the second side facing toward the substrate, and covering the first side of the microelectronic die with a dielectric layer after placing the microelectronic die in the recess. In a further aspect of this embodiment, the substrate can include a thermal conductive substrate, such as a substrate comprised of copper, aluminum, or an alloy. In another aspect of this embodiment, the substrate can have a coefficient of thermal expansion at least approximately equal to the coefficient of thermal expansion of the microelectronic die or a printed circuit board.

In another embodiment of the invention, the method includes placing the microelectronic die in the recess in the substrate with the second side facing toward the substrate, covering the first side of the microelectronic die with the dielectric layer, and disposing a conductive link in the dielectric layer that is electrically coupled to at least one bond-pad. In a further aspect of this embodiment, the substrate can be a generally circular substrate. In another aspect of this embodiment, the method can further include placing an electrical coupler on the at least one bond-pad of the microelectronic die before covering the first side of the microelectronic die with the dielectric layer.

Another aspect of the invention is directed to a packaged microelectronic device. In one embodiment, the device includes a single, continuous substrate having a recess and a microelectronic die having an integrated circuit, a first side with a plurality of bond-pads electrically coupled to the integrated circuit, and a second side opposite the first side. The microelectronic die is received within the recess with the second side facing the substrate. The device also includes a dielectric layer over the microelectronic die and a ball-pad in or on the dielectric layer. The ball-pad is electrically coupled to one of the plurality of bond-pads. In a further aspect of this embodiment, the substrate can be a thermally conductive substrate. For example, the substrate can include copper, aluminum, or an alloy.

BRIEF DESCRIPTION OF THE DRAWINGS

FIG. 2 is a schematic side cross-sectional view of microelectronic devices after microelectronic dies are received in recesses in the substrate.

FIG. 3 is a schematic side cross-sectional view of the microelectronic devices after depositing a dielectric layer and forming vias in the dielectric layer.

FIG. 4 is a schematic side cross-sectional view of the microelectronic devices after forming conductive links.

FIG. 5 is a schematic side cross-sectional view of the microelectronic devices after depositing a second dielectric layer and forming vias in the second dielectric layer.

FIG. 6 is a schematic side cross-sectional view of the microelectronic devices after depositing ball-pads and solder balls.

FIG. 7 is a schematic side cross-sectional view of microelectronic devices after microelectronic dies are received in recesses in the substrate and electrical couplers are formed on the dies.

FIG. 8 is a schematic side cross-sectional view of the microelectronic devices after covering the substrate and the microelectronic dies with a first dielectric layer.

FIG. 9 is a schematic side cross-sectional view of the microelectronic devices after forming conductive links.

FIG. 10 is a schematic side cross-sectional view of the microelectronic devices after depositing a second dielectric layer.

FIG. 11 is a schematic side cross-sectional view of the microelectronic devices after depositing ball-pads and solder balls.

DETAILED DESCRIPTION

The following description is directed toward packaged microelectronic devices and methods for packaging microelectronic devices. Many specific details of several embodiments are described below with reference to packaged microelectronic devices having microelectronic dies and a substrate to provide a thorough understanding of such embodiments. The present invention, however, can be practiced using other types of microelectronic devices and/or micromechanical devices. Those of ordinary skill in the art will thus understand that the invention may have additional embodiments, or that the invention may be practiced without several of the details described below.

Figure 1A:
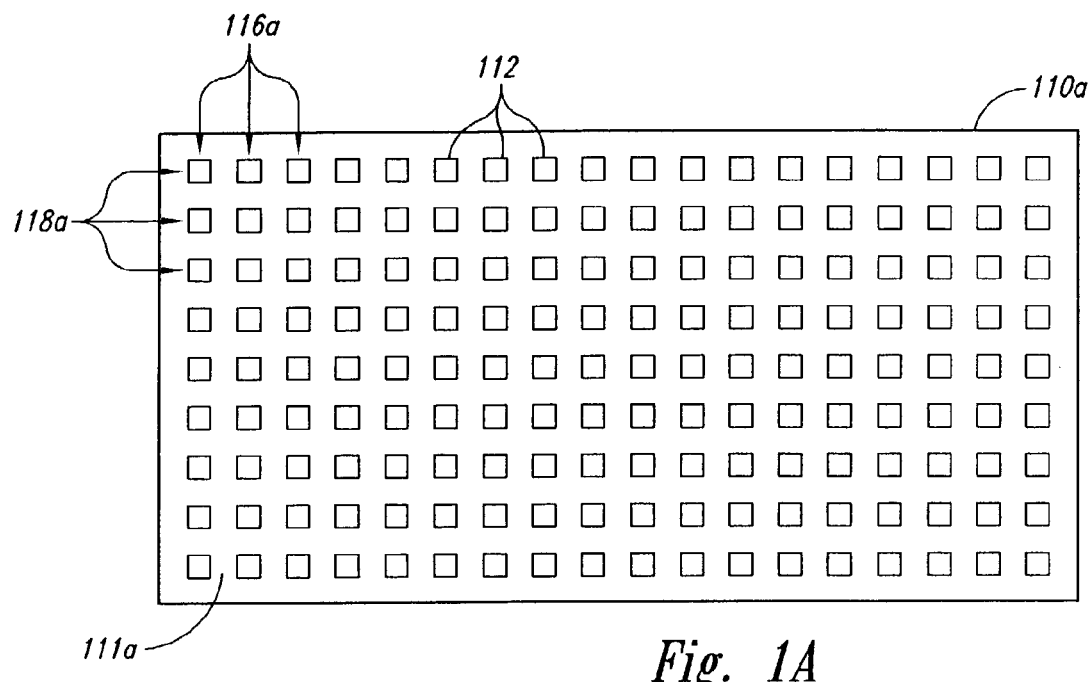
FIG. 1A is a top plan view of a rectilinear substrate in accordance with one embodiment of the invention.

FIG. 1A is a top plan view of a rectilinear substrate 110a in accordance with one embodiment of the invention. The rectilinear substrate 110a has a first surface 111a with a plurality of recesses 112. The recesses 112 can be arranged in a series of columns 116a and rows 118a or in another arrangement. The recesses 112 are shaped to receive one or more microelectronic dies. For example, in the illustrated embodiment, the recesses 112 have a generally rectangular shape. In other embodiments, the recesses 112 can have other shapes. In one aspect of the illustrated embodiment, the recesses 112 can be formed in the substrate 110a by etching, coining, stamping, or other suitable processes. In another aspect of the embodiment, the substrate 110a can comprise a thermally conductive material as described in greater detail below.

Figure 1B:
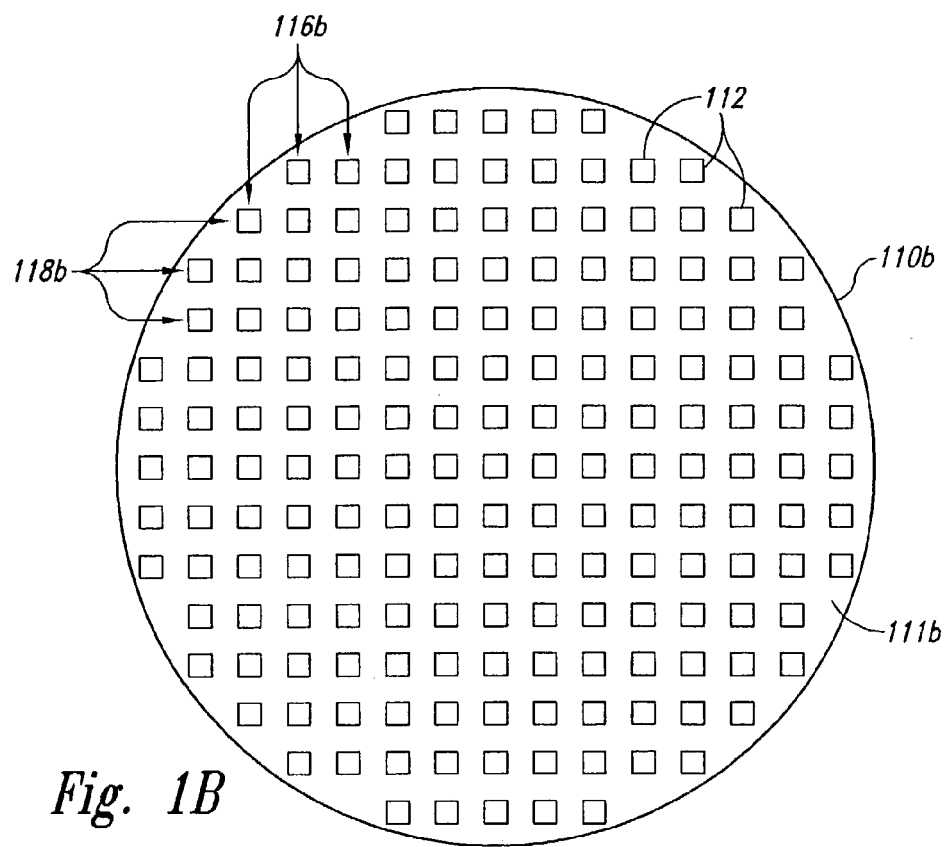
FIG. 1B is a top plan view of a circular substrate in accordance with another embodiment of the invention.

FIG. 1B is a top plan view of a circular substrate 110b in accordance with another embodiment of the invention. The circular substrate 110b has a first surface 111b with a plurality of recesses 112. The recesses 112 can be arranged in a series of columns 116b and rows 118b or in another arrangement. One advantage of the substrate 110b is that it can be used on equipment set up for circular substrates.

FIGS. 2-6 illustrate various stages in a method of packaging microelectronic devices in accordance with one embodiment of the invention. In the illustrated method, the microelectronic devices are packaged as part of a batch process. In other embodiments, a single microelectronic device can be packaged according to the illustrated method.

Figure 2:
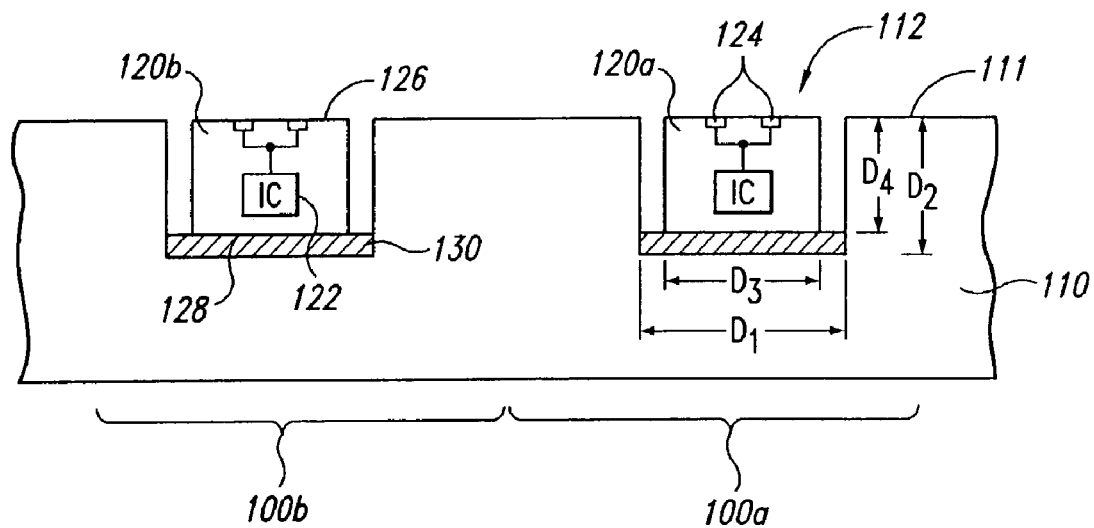
FIGS. 2-6 illustrate various stages in a method of packaging microelectronic devices in accordance with one embodiment of the invention.

FIG. 2 is a schematic side cross-sectional view of microelectronic devices 100 (identified individually as 100a-b) after microelectronic dies are received in recesses in the substrate. Each microelectronic device 100 can include a portion of a substrate 110, such as a mounting member, having a recess 112 and a microelectronic die 120 (identified individually as 120a-b) received within the recess 112. The substrate 110 can be similar to the substrate 110a described above with reference to FIG. 1A or the substrate 110b described above with reference to FIG. 1B. In one aspect of the illustrated embodiment, an adhesive 130 is deposited into the recesses 112 of the substrate 110 to bond the microelectronic dies 120 to the substrate 110. The adhesive 130 can be deposited into the recesses 112 by placing a volume of adhesive on a first surface 111 of the substrate 110 and moving a wiper blade across the first surface 111 to drive the adhesive 130 into the recesses 112 before placing the dies 120 in the recesses 112. In other embodiments, the adhesive 130 can be deposited into the recesses 112 by other devices, such as by a pin transfer mechanism or screen-printing. In additional embodiments, the microelectronic devices 100 may not include the adhesive 130.

The microelectronic dies 120 are placed into the recesses 112 of the substrate 110 after singulating the dies 120. In one aspect of this embodiment, the microelectronic dies 120 include an integrated circuit 122 (shown schematically), a first side 126 with bond-pads 124 electrically coupled to the integrated circuit 122, and a second side 128 opposite the first side 126. The microelectronic dies 120 are placed into the recesses 112 with the second side 128 facing the substrate 130. The microelectronic dies 120 can be placed into the recesses 112 by conventional die attach equipment. The recesses 112 can have a width $D_1$ greater than the width $D_3$ of the microelectronic dies 120 and a depth $D_2$ greater than the height $D_4$ of the microelectronic dies 120. Accordingly, the microelectronic dies 120 are received within the recesses 112. In other embodiments, the height of the microelectronic die may exceed the depth of the recess.

Figure 3:
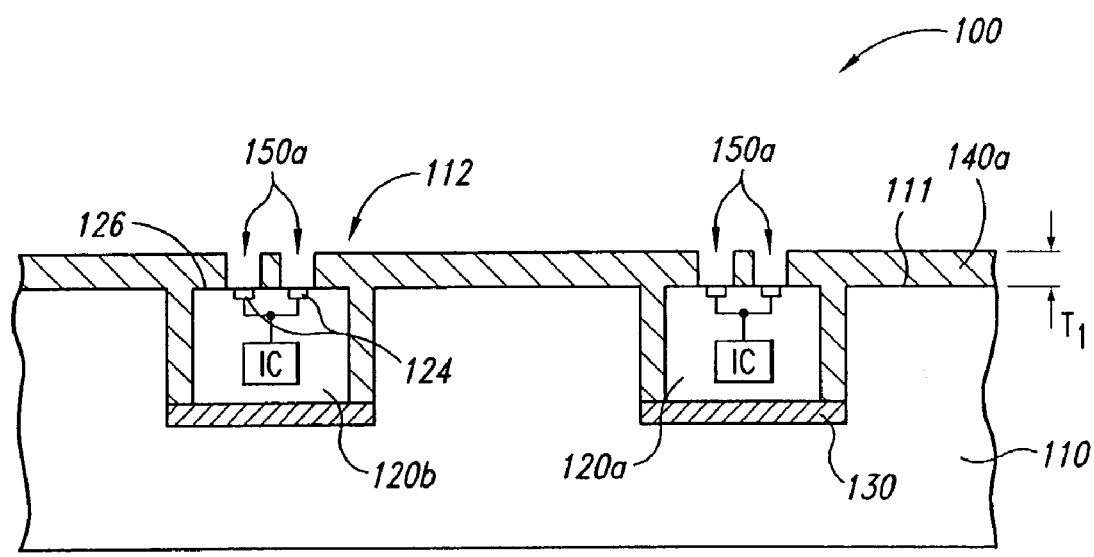

FIG. 3 is a schematic side cross-sectional view of the microelectronic devices 100 after depositing a dielectric layer and forming vias in the dielectric layer. After the microelectronic dies 120 are placed in the recesses 112 of the substrate 110, a first dielectric layer 140a having a thickness $T_1$ is deposited across the first surface 111 of the substrate 110 and the first sides 126 of the microelectronic dies 120. The dielectric material can also fill the gap in the recesses 112 between the substrate 110 and the microelectronic dies 120. In other embodiments, a filler can be used to fill the gap in the recesses 112 between the substrate 110 and the microelectronic dies 120. After the first dielectric layer 140a has been deposited, portions of the first dielectric layer 140a are removed to form vias 150a over the bond-pads 124 of the microelectronic die 120. More specifically, in the illustrated embodiment, each via 150a is aligned with a corresponding bond-pad 124. The vias 150a can be formed in the first dielectric layer 140a by etching, laser drilling, or other suitable processes.

Figure 4:
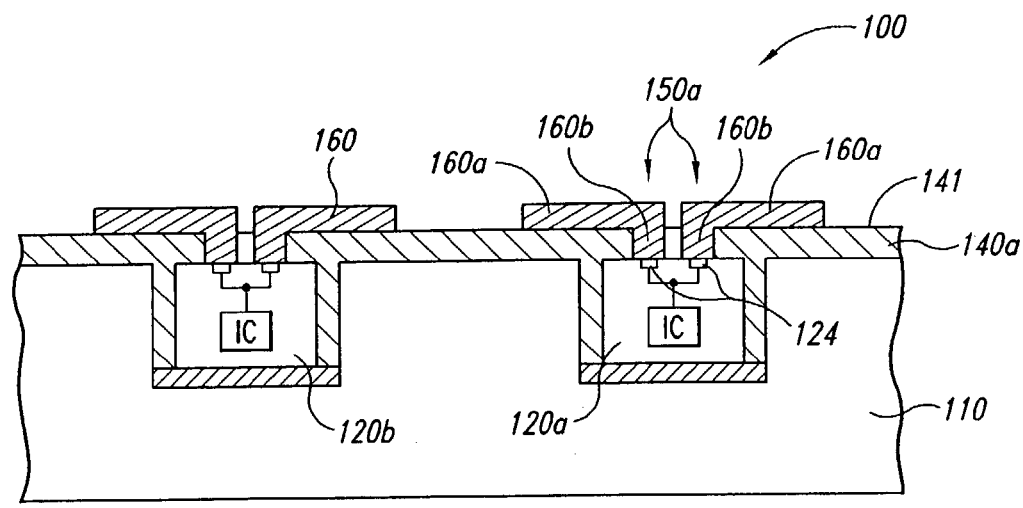

FIG. 4 is a schematic side cross-sectional view of the microelectronic devices 100 after forming conductive links 160. The conductive links 160 include a horizontal portion 160a that extends along a first surface 141 of the first dielectric layer 140a and a vertical portion 160b in the via 150a. The vertical portion 160b of the conductive link 160 electrically couples the horizontal portion 160a to the bond-pads 124 of the microelectronic die 120. In one aspect of this embodiment, each bond-pad 124 has a corresponding conductive link 160. In another aspect of the illustrated embodiment, the conductive links 160 can be formed by depositing a seed layer and then plating a conductive material onto the seed layer. In other embodiments, the conductive links 160 can be formed through other methods.

Figure 5:
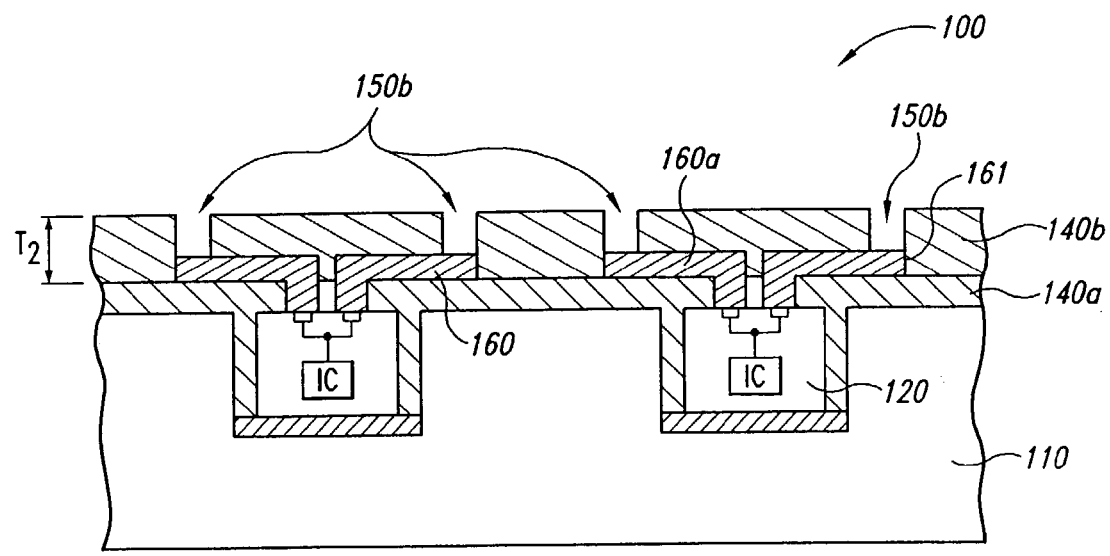

FIG. 5 is a schematic side cross-sectional view of the microelectronic devices 100 after depositing a second dielectric layer and forming vias in the second dielectric layer. Once the conductive links 160 are formed on the microelectronic devices 100, a second dielectric layer 140b having a thickness $T_2$ is deposited across the substrate 110. In the illustrated embodiment, the second dielectric layer 140b covers the first dielectric layer 140a and the conductive links 160. After the second dielectric layer 140b has been deposited, portions of the layer 140b are removed to create vias 150b that extend to the conductive links 160. The vias 150b can be formed proximate to the ends 161 of the conductive links 160.

Figure 6:
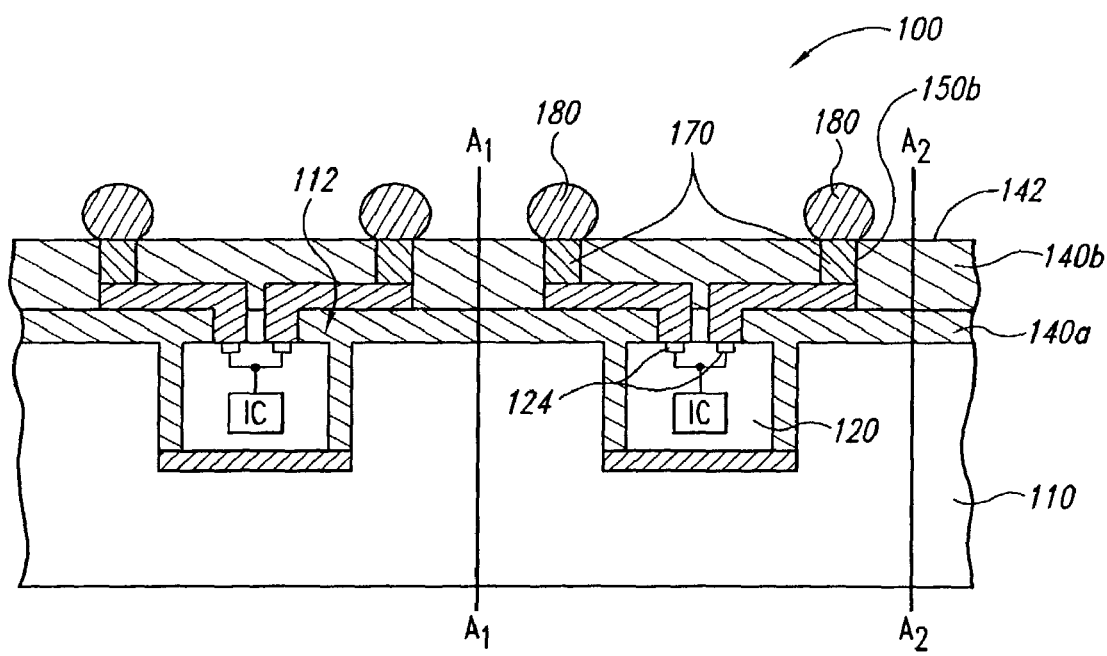

FIG. 6 is a schematic side cross-sectional view of the microelectronic devices 100 after depositing ball-pads and solder balls. Once the vias 150b are formed in the second dielectric layer 140b, ball-pads 170 are formed in the vias 150b and then solder balls 180 are deposited onto the ball-pads 170. The solder balls 180 are electrically coupled to the bond-pads 124 of the microelectronic die 120, and thus the solder balls 180, ball-pads 170, and conductive links 160 form a redistribution assembly. In the illustrated embodiment, the solder balls 180 are superimposed over the substrate 110 but not the recesses 112. In other embodiments, the conductive links may have a different length, and accordingly the ball-pads and solder balls can be arranged differently, such as being superimposed over the microelectronic die 120. The substrate 110 can be back ground to reduce the profile of the packaged microelectronic devices 100, and the substrate 110 and dielectric layers 140a-b can be cut along lines $A_1$ and $A_2$ to singulate the microelectronic devices 100. Each microelectronic device 100 can be attached to a printed circuit board or other device. In other embodiments, a microelectronic device can include two or more microelectronic dies to create a higher density microelectronic device.

In one aspect of the microelectronic device 100 illustrated in FIGS. 2-6, the substrate 110 can be thermally conductive to transfer heat from the microelectronic die 120 to an external heat sink (not shown). For example, in one embodiment, the substrate 110 can comprise copper, aluminum, or an alloy (e.g., an NiFe alloy such as alloy 42). In another embodiment, such as in a chip scale package, a substrate can have a coefficient of thermal expansion at least generally similar to the coefficient of thermal expansion of the microelectronic die. In this embodiment, the thermal stress between the microelectronic die and the substrate caused by thermal cycling is reduced because the coefficients of thermal expansion of the substrate and the microelectronic die are similar. In other embodiments, such as those with a larger package, the substrate can have a coefficient of thermal expansion at least generally similar to the coefficient of thermal expansion of a printed circuit board. In these embodiments, the thermal stress between the printed circuit-board and substrate is reduced.

Figure 7:
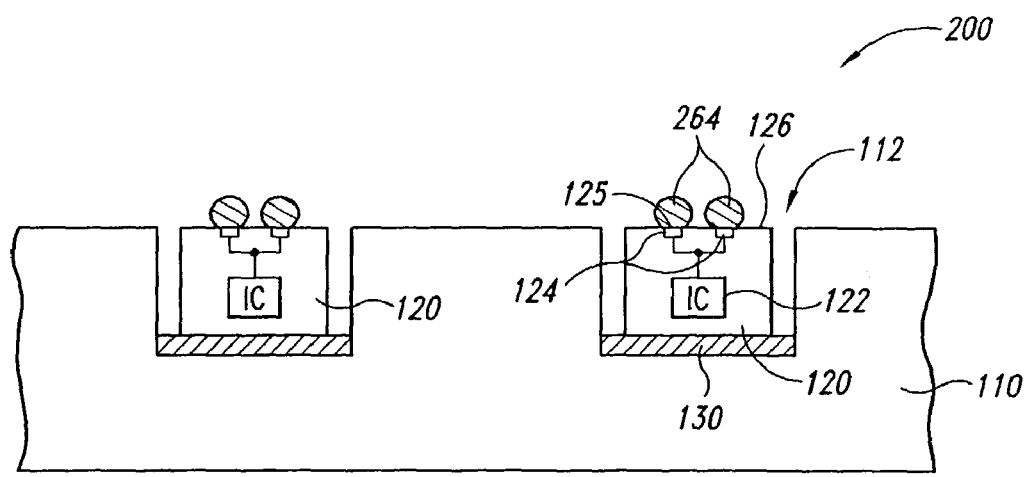
FIGS. 7-11 illustrate various stages in a method of packaging microelectronic devices in accordance with another embodiment of the invention.

FIGS. 7-11 illustrate various stages in a method of packaging microelectronic devices in accordance with another embodiment of the invention. FIG. 7 is a schematic side cross-sectional view of microelectronic devices 200 after the microelectronic dies 120 are received in recesses in the substrate 110 and electrical couplers 264 are formed on the dies 120. In the illustrated embodiment, the microelectronic devices 200 are generally similar to the microelectronic devices 100 described above with reference to FIG. 2. For example, the microelectronic devices 200 include a substrate 110 having recesses 112 and microelectronic dies 120 received within the recesses 112. The microelectronic devices 200 also include a plurality of electrical couplers 264 deposited on the bond-pads 124 of the microelectronic dies 120. More specifically, the electrical couplers 264 are deposited on a surface 125 of corresponding bond-pads 124. Accordingly, the electrical couplers 264 can be electrically coupled to the integrated circuit 122 of the microelectronic die 120.

Figure 8:
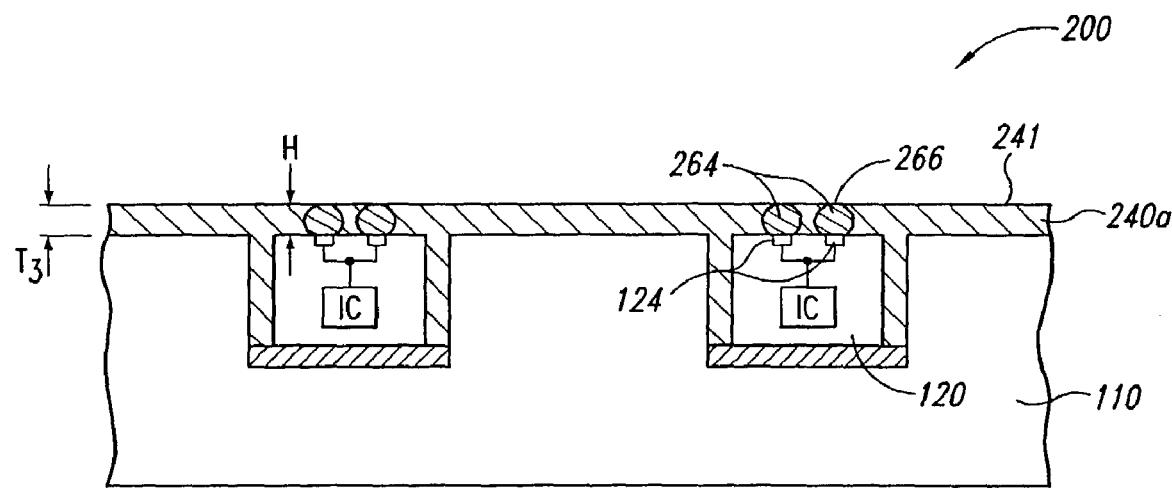

FIG. 8 is a schematic side cross-sectional view of the microelectronic devices 200 after covering the substrate 110 and the microelectronic dies 120 with a first dielectric layer 240a. Once electrical couplers 264 are placed on the bond-pads 124, a first dielectric layer 240a is deposited across the substrate 110 and the microelectronic dies 120. The first dielectric layer 240a has a thickness $T_3$ and can be spun-on or otherwise dispensed onto the substrate 110 and dies 120. The electrical couplers 264 have a height H and can be grounded so that a top surface 266 of the electrical couplers 264 does not project beyond a first surface 241 of the first dielectric layer 240a.

Figure 9:
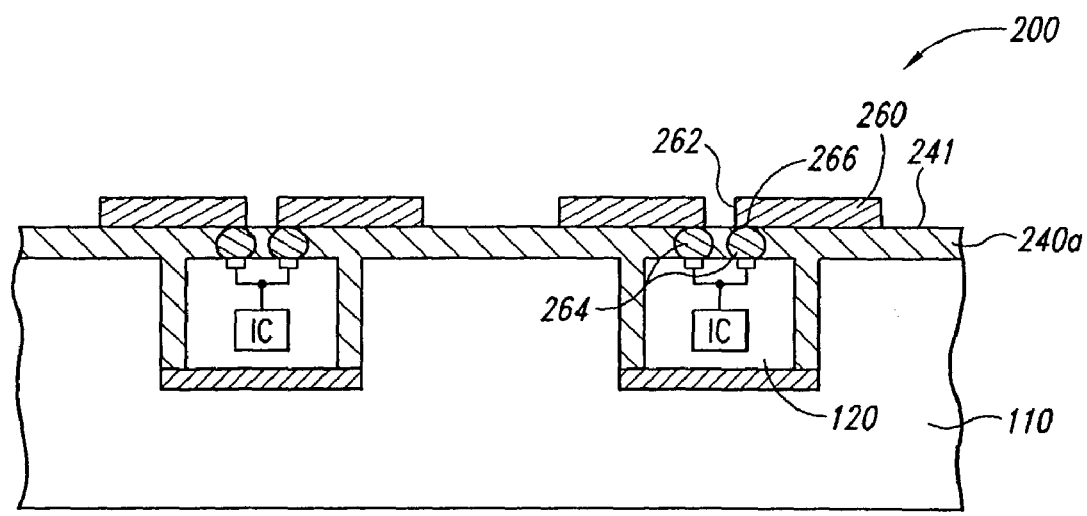

FIG. 9 is a schematic side cross-sectional view of the microelectronic devices 200 after forming conductive links 260. The conductive links 260 are formed on the first surface 241 of the first dielectric layer 240a to be in physical contact with corresponding electrical couplers 264. For example, in the illustrated embodiment, the conductive links 260 have a first end 262 positioned at least proximate to the top surface 266 of the electrical couplers 264.

Figure 10:
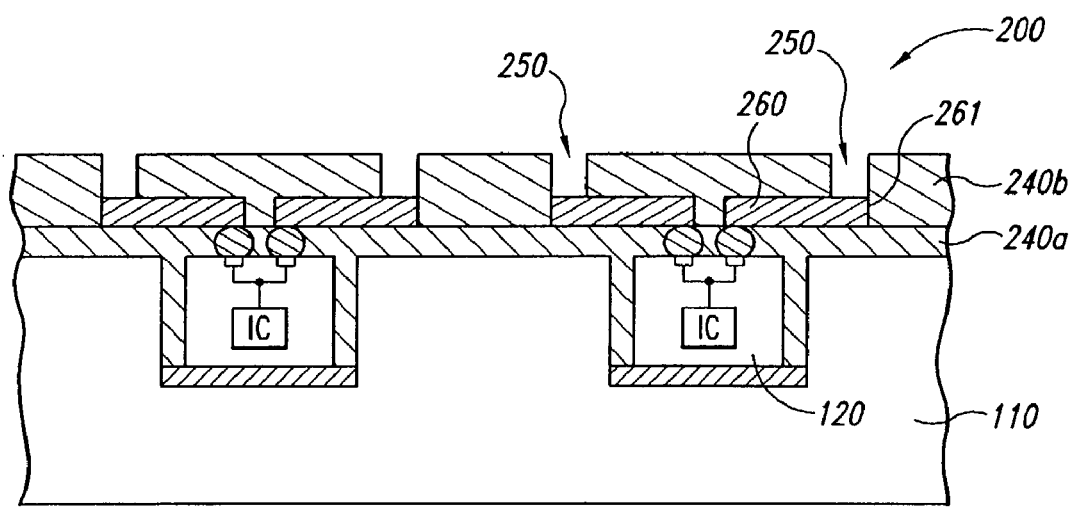

FIG. 10 is a schematic side cross-sectional view of the microelectronic devices 200 after depositing a second dielectric layer 240b. In one aspect of the illustrated embodiment, the second dielectric layer 240b is deposited over the first dielectric layer 240a and the conductive links 260. After depositing the second dielectric layer 240b, portions of the layer 240b are removed to create vias 250. In the illustrated embodiment, the vias 250 are formed proximate to a second end 261 of the conductive links 260. In other embodiments, the vias 250 can be formed at other positions along the conductive link 260.

Figure 11:
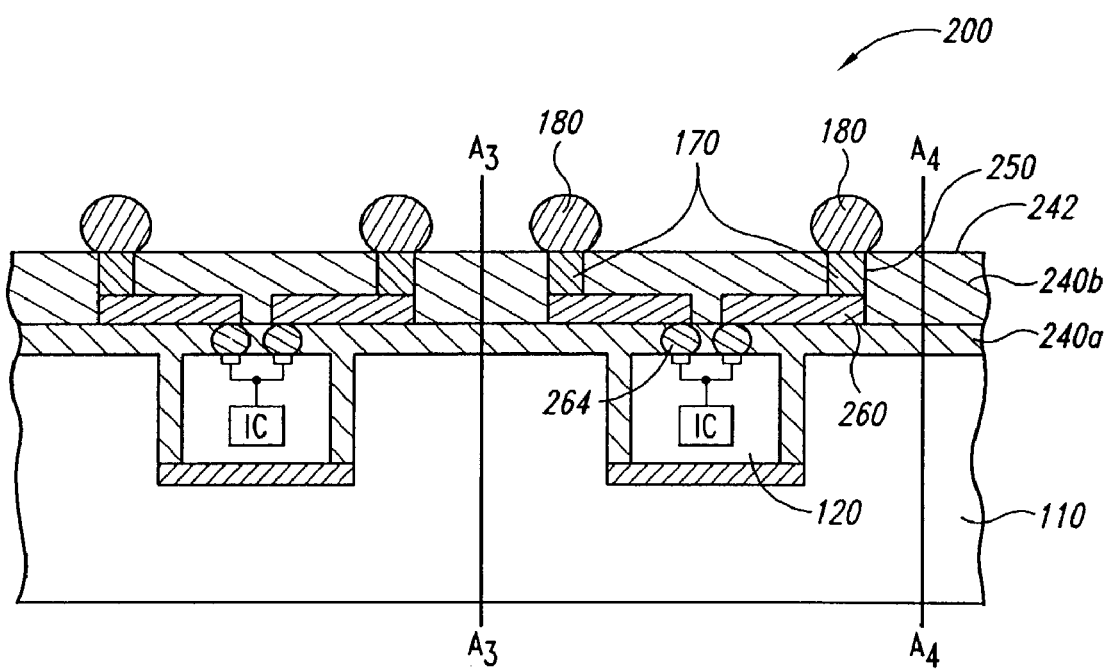

FIG. 11 is a schematic side cross-sectional view of the microelectronic devices 200 after depositing ball-pads 170 and solder balls 180. Once the vias 250 have been formed in the second dielectric layer 240b, a plurality of ball-pads 170 are formed in the vias 250. Next, a plurality of solder balls 180 are deposited onto corresponding ball-pads 170. In another aspect of this embodiment, the substrate 110 and the dielectric layers 240a-b can be cut along lines A₃ and A₄ to singulate the microelectronic devices 200.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method of packaging a microelectronic device including a microelectronic die having an integrated circuit, a first side with a plurality of bond sites electrically coupled to the integrated circuit, a second side opposite the first side, and a plurality of ends extending between the first and second sides, the method comprising:
    forming a recess in a substrate;
    placing the microelectronic die in the recess formed in the substrate with the second side facing toward a first portion of the substrate and the ends facing toward a second portion of the substrate, wherein the first and second portions of the substrate are comprised of at least the same material;
    disposing an electric coupler on one of the plurality of bond sites; and
    depositing a dielectric layer directly onto the first side of the microelectronic die and the electric coupler after placing the microelectronic die in the recess.

2. The method of claim 1, further comprising disposing a conductive link in the dielectric layer that is in physical contact with the electric coupler.

3. The method of claim 2, wherein the dielectric layer is a first dielectric layer, and wherein the method further includes disposing a second dielectric layer over the first dielectric layer and the conductive link.

4. The method of claim 1 wherein the dielectric layer has a thickness approximately equal to a height of the electric coupler.

5. The method of claim 1 wherein the substrate comprises a thermally conductive substrate, and wherein forming the recess in the substrate comprises forming a depression in the thermally conductive substrate.

6. The method of claim 1 wherein the substrate comprises a thermally conductive substrate comprised of copper, and wherein forming the recess in the substrate comprises forming a depression in the thermally conductive copper substrate.

7. The method of claim 1 wherein the substrate comprises a thermally conductive substrate comprised of aluminum, and wherein forming the recess in the substrate comprises forming a depression in the thermally conductive aluminum substrate.

8. The method of claim 1 wherein the substrate comprises a generally circular substrate, and wherein forming the recess in the substrate comprises forming a depression in the generally circular substrate.

9. The method of claim 1 wherein:
    the substrate has a first coefficient of thermal expansion; and
    the microelectronic die has a second coefficient of thermal expansion at least approximately equal to the first coefficient of thermal expansion.

10. The method of claim 1 wherein the substrate has a first coefficient of thermal expansion that is at least approximately equal to a second coefficient of thermal expansion of a printed circuit board.

11. The method of claim 1 wherein the recess is one of a plurality of recesses, wherein the microelectronic die is one of a plurality of microelectronic dies having first sides and second sides, and wherein the method further comprises:
    forming the plurality of recesses in the substrate;
    placing the plurality of microelectronic dies in corresponding recesses formed in the substrate with the second sides facing toward the substrate; and
    covering the first sides of the microelectronic dies with the dielectric layer after placing the microelectronic dies in the recesses.

12. The method of claim 1, further comprising disposing an adhesive in the recess.

13. The method of claim 1, further comprising depositing a solder ball on a ball site in or on the dielectric layer, wherein the ball site is electrically coupled to at least one bond site of the microelectronic die.

14. A method of packaging a microelectronic device including a microelectronic die having a first side with a plurality of bond sites and a second side opposite the first side, the method comprising:
    placing the microelectronic die in a blind recess in a substrate with the second side facing toward the substrate;
    disposing an electric coupler on one of the plurality of bond sites;
    depositing a dielectric layer directly onto the first side of the microelectronic die and the electric coupler, the dielectric layer having a thickness approximately equal to a height of the electric coupler; and
    forming an array of ball sites on and/or in the dielectric layer, wherein the ball sites are electrically coupled to corresponding bond sites on the die.

15. The method of claim 14, further comprising forming the blind recess in the substrate.

16. The method of claim 14, further comprising connecting the electrical coupler to the at least one bond site of the microelectronic die before covering the first side of the microelectronic die.

17. The method of claim 14 wherein the substrate comprises a thermally conductive substrate, and wherein placing the microelectronic die in the recess in the substrate comprises placing the microelectronic die in a depression in the thermally conductive substrate.

18. The method of claim 14 wherein the substrate comprises a thermally conductive substrate comprised of copper, and wherein placing the microelectronic die in the recess in the substrate comprises placing the microelectronic die in a depression in the thermally conductive copper substrate.

19. The method of claim 14 wherein the substrate comprises a thermally conductive substrate comprised of aluminum, and wherein placing the microelectronic die in the recess in the substrate comprises placing the microelectronic die in a depression in the thermally conductive aluminum substrate.

20. The method of claim 14 wherein the substrate comprises a generally circular substrate, and wherein placing the microelectronic die in the recess in the substrate comprises placing the microelectronic die in a depression in the generally circular substrate.

21. The method of claim 14 wherein:
    the substrate has a first coefficient of thermal expansion; and
    the microelectronic die has a second coefficient of thermal expansion at least approximately equal to the first coefficient of thermal expansion.

22. The method of claim 14 wherein the substrate has a first coefficient of thermal expansion that is at least approximately equal to a second coefficient of thermal expansion of a printed circuit board.

23. The method of claim 14 wherein the recess is one of a plurality of recesses, wherein the microelectronic die is one of a plurality of microelectronic dies having first sides and second sides, and wherein the method further comprises:
   placing the plurality of microelectronic dies in corresponding blind recesses in the substrate with the second sides facing toward the substrate; and
   covering the first sides of the microelectronic dies with the dielectric layer.

24. A method of packaging a microelectronic device including a microelectronic die having a first side with a plurality of bond sites and a second side opposite the first side, the method comprising:
   placing the microelectronic die in a recess of a substrate with the second side facing toward the substrate;
   connecting an electrical coupler to a bond site of the microelectronic die;
   depositing a dielectric layer directly onto the first side of the microelectronic die and the electric coupler after connecting the electrical coupler to the bond site, the dielectric layer having a thickness approximately equal to a height of the electric coupler; and
   disposing a conductive link in the dielectric layer that is electrically coupled to the electrical coupler after covering the first side of the die with the dielectric layer.

25. The method of claim 24, further comprising forming the recess in the substrate.

26. The method of claim 24 wherein the substrate comprises a thermally conductive substrate, and wherein placing the microelectronic die in the recess in the substrate comprises placing the microelectronic die in the recess in the thermally conductive substrate.

27. The method of claim 24 wherein the substrate comprises a thermally conductive substrate comprised of copper, and wherein placing the microelectronic die in the recess in the substrate comprises placing the microelectronic die in a depression in the thermally conductive copper substrate.

28. The method of claim 24 wherein the substrate comprises a thermally conductive substrate comprised of aluminum, and wherein placing the microelectronic die in the recess in the substrate comprises placing the microelectronic die in a depression in the thermally conductive aluminum substrate.

29. The method of claim 24 wherein the substrate comprises a generally circular substrate, and wherein placing the microelectronic die in the recess in the substrate comprises placing the microelectronic die in a depression in the generally circular substrate.

30. The method of claim 24 wherein:
   the substrate has a first coefficient of thermal expansion; and
   the microelectronic die has a second coefficient of thermal expansion at least approximately equal to the first coefficient of thermal expansion.

31. The method of claim 24 wherein the substrate has a first coefficient of thermal expansion that is at least approximately equal to a second coefficient of thermal expansion of a printed circuit board.

32. The method of claim 24 wherein the recess is one of a plurality of recesses, wherein the microelectronic die is one of a plurality of microelectronic dies having first sides and second sides, wherein the electrical coupler is one of a plurality of electrical couplers, and wherein the method further comprises:
   placing the plurality of microelectronic dies in corresponding recesses in the substrate with the second sides facing toward the substrate;
   connecting the plurality of electrical couplers to corresponding bond sites of the microelectronic dies; and
   covering the first sides of the microelectronic dies with the dielectric layer after connecting the electrical couplers.

33. A method of packaging a microelectronic device including a microelectronic die having a first side with a plurality of bond sites and a second side opposite the first side, the method comprising:
   placing the microelectronic die in a recess of a substrate with the second side facing toward the substrate;
   disposing an electric coupler on one of the plurality of bond sites;
   depositing a first dielectric layer directly onto the first side of the microelectronic die and the electric coupler, the first dielectric layer having a thickness approximately equal to a height of the electric coupler;
   disposing a first conductive link in the first dielectric layer that is electrically coupled to at least one bond site via the electric coupler;
   disposing a second conductive link on or in the first dielectric layer that is electrically coupled to the first conductive link;
   depositing a second dielectric layer over the first dielectric layer after disposing the first conductive link in the first dielectric layer; and
   placing a ball site in or on the second dielectric layer that is electrically coupled to the second conductive link.

34. The method of claim 33, further comprising forming the recess in the substrate.

35. The method of claim 33 wherein the substrate comprises a thermally conductive substrate, and wherein placing the microelectronic die in the recess in the substrate comprises placing the microelectronic die in a depression in the thermally conductive substrate.

36. The method of claim 33 wherein the substrate comprises a thermally conductive substrate comprised of copper, and wherein placing the microelectronic die in the recess in the substrate comprises placing the microelectronic die in a depression in the thermally conductive copper substrate.

37. The method of claim 33 wherein the substrate comprises a thermally conductive substrate comprised of aluminum, and wherein placing the microelectronic die in the recess in the substrate comprises placing the microelectronic die in a depression in the thermally conductive aluminum substrate.

38. The method of claim 33 wherein the substrate comprises a generally circular substrate, and wherein placing the microelectronic die in the recess in the substrate comprises placing the microelectronic die in a depression in the generally circular substrate.

39. The method of claim 33 wherein:
   the substrate has a first coefficient of thermal expansion; and
   the microelectronic die has a second coefficient of thermal expansion at least approximately equal to the first coefficient of thermal expansion.

40. A method of packaging a microelectronic device including a microelectronic die having a first side with a plurality of bond sites and a second side opposite the first side, the method comprising:

placing the microelectronic die in a recess of a substrate with the second side facing toward the substrate;

placing an electrical coupler on one of the plurality of bond sites of the microelectronic die;

depositing a first dielectric layer directly onto the first side of the microelectronic die and the electric coupler after placing the electrical coupler, the first dielectric layer having a thickness approximately equal to a height of the electric coupler;

disposing a conductive link in or on the first dielectric layer that is electrically coupled to the electrical coupler;

depositing a second dielectric layer over the first dielectric layer after disposing the conductive link in or on the first dielectric layer; and placing a ball site in or on the second dielectric layer that is electrically coupled to the conductive link.

41. The method of claim 40, further comprising forming the recess in the substrate.

42. The method of claim 40 wherein the substrate comprises a thermally conductive substrate, and wherein placing the microelectronic die in the recess in the substrate comprises placing the microelectronic die in a depression in the thermally conductive substrate.

43. The method of claim 40 wherein the substrate comprises a thermally conductive substrate comprised of copper, and wherein placing the microelectronic die in the recess in the substrate comprises placing the microelectronic die in a depression in the thermally conductive copper substrate.

44. The method of claim 40 wherein the substrate comprises a thermally conductive substrate comprised of aluminum, and wherein placing the microelectronic die in the recess in the substrate comprises placing the microelectronic die in a depression in the thermally conductive aluminum substrate.

45. The method of claim 40 wherein the substrate comprises a generally circular substrate, and wherein placing the microelectronic die in the recess in the substrate comprises placing the microelectronic die in a depression in the generally circular substrate.

46. The method of claim 40 wherein:

the substrate has a first coefficient of thermal expansion; and the microelectronic die has a second coefficient of thermal expansion at least approximately equal to the first coefficient of thermal expansion.

47. A method of packaging a plurality of microelectronic dies having a first side with a plurality of bond sites and a second side opposite the first side, the method comprising:

forming a plurality of recesses in a first side of a substrate;

placing the plurality of microelectronic dies in corresponding recesses formed in the substrate with the second side of the microelectronic dies facing toward the substrate;

disposing an electric coupler on one of the plurality of bond sites of each of the plurality of microelectronic dies;

disposing a dielectric layer directly onto the first side of the plurality of microelectronic dies and the electric coupler, the first dielectric layer having a thickness approximately equal to a height of the electric coupler; and forming a plurality of ball sites in the dielectric layer, the ball sites being electrically coupled to the plurality of bond sites.

48. The method of claim 47, further comprising placing a plurality of electrical couplers on corresponding bond sites of the microelectronic dies.

49. The method of claim 47 wherein forming the plurality of recesses comprises removing material from the substrate.

50. The method of claim 47 wherein the substrate comprises a thermally conductive substrate, and wherein forming recesses in the substrate comprises forming depressions in the thermally conductive substrate.

51. The method of claim 47 wherein the substrate comprises a thermally conductive substrate comprised of copper, and wherein forming recesses in the substrate comprises forming depressions in the thermally conductive copper substrate.

52. The method of claim 47 wherein the substrate comprises a thermally conductive substrate comprised of aluminum, and wherein forming recesses in the substrate comprises forming depressions in the thermally conductive aluminum substrate.

53. The method of claim 47 wherein the substrate comprises a generally circular substrate, and wherein forming recesses in the substrate comprises forming depressions in the generally circular substrate.

54. The method of claim 47 wherein:

the substrate has a first coefficient of thermal expansion; and the microelectronic dies have a second coefficient of thermal expansion at least approximately equal to the first coefficient of thermal expansion.

55. The method of claim 47 wherein the substrate has a first coefficient of thermal expansion that is at least approximately equal to a second coefficient of thermal expansion of a printed circuit board.

* * * * *

UNITED STATES PATENT AND TRADEMARK OFFICE
CERTIFICATE OF CORRECTION

| | | |
|---|---|---|
| PATENT NO. | : 7,312,101 B2 | Page 1 of 1 |
| APPLICATION NO. | : 10/421452 | |
| DATED | : December 25, 2007 | |
| INVENTOR(S) | : Jiang et al. | |

It is certified that error appears in the above-identified patent and that said Letters Patent is hereby corrected as shown below:

On the Title page, in "Primary Examiner", in column 2, line 1, delete "Chuogn" and insert -- Chuong --, therefor.

In column 7, line 31, in Claim 3, delete "claim 2," and insert -- claim 2 --, therefor.

Signed and Sealed this

Twenty Second Day of April, 2008

JON W. DUDAS
*Director of the United States Patent and Trademark Office*